United States Patent
Stangl et al.

(10) Patent No.: US 8,863,684 B2
(45) Date of Patent: Oct. 21, 2014

(54) APPARATUS AND METHOD FOR SMOOTHLY COATING SUBSTRATES

(75) Inventors: Wolfgang Stangl, Eichenau (DE); Hans-Jürgen Stangl, Neuhausen (DE)

(73) Assignees: Stangl Semiconductor Equipment AG, Eichenau (DE); Würth Solar GmbH & Co. KG, Schwaebisch Hall (DE)

( * ) Notice: Subject to any disclaimer, the term of this patent is extended or adjusted under 35 U.S.C. 154(b) by 1453 days.

(21) Appl. No.: 12/279,394

(22) PCT Filed: Feb. 13, 2007

(86) PCT No.: PCT/EP2007/001246
§ 371 (c)(1),
(2), (4) Date: Oct. 28, 2008

(87) PCT Pub. No.: WO2007/093390
PCT Pub. Date: Aug. 23, 2007

(65) Prior Publication Data
US 2009/0311431 A1 Dec. 17, 2009

(30) Foreign Application Priority Data
Feb. 17, 2006 (DE) .......................... 10 2006 007 446

(51) Int. Cl.
| | |
|---|---|
| B05C 13/00 | (2006.01) |
| B05C 5/00 | (2006.01) |
| B05D 1/02 | (2006.01) |
| B05C 15/00 | (2006.01) |
| B05C 11/08 | (2006.01) |
| B05C 9/06 | (2006.01) |
| B05B 15/12 | (2006.01) |
| H01L 21/67 | (2006.01) |

(52) U.S. Cl.
CPC ............... *B05C 11/08* (2013.01); *B05C 15/00* (2013.01); *B05C 9/06* (2013.01); *H01L 21/6715* (2013.01); *B05C 5/008* (2013.01); *B05B 15/1203* (2013.01); *B05C 5/004* (2013.01)
USPC .............................. 118/56; 118/300; 427/424

(58) Field of Classification Search
USPC .......................................... 118/56, 57
See application file for complete search history.

(56) References Cited

U.S. PATENT DOCUMENTS 3,031,339 A * 4/1962 Regan, Sr. et al. ............ 427/144
3,103,406 A * 9/1963 Milewski et al. ............... 264/71

(Continued)

FOREIGN PATENT DOCUMENTS

| DE | 1 947 484 A1 | 3/1971 |
| EP | 1639896 A1 * | 3/2006 |

(Continued)

OTHER PUBLICATIONS

English Machine translation of EP1639896 (2006).*

(Continued)

*Primary Examiner* — Dah-Wei D Yuan
*Assistant Examiner* — Charles Capozzi
(74) *Attorney, Agent, or Firm* — Keating & Bennett, LLP (57) ABSTRACT

The surface of a substrate may be smoothly covered with a liquid when the substrate is fixed in a holder which together with forms, together with the surface of the substrate, a process volume into which the liquid may be introduced onto the surface of the substrate by means of a wetter, and when the holder including the substrate is set in a swaying motion by means of a swayer, so that the liquid will smoothly spread on the surface of the substrate. By the swaying motion, concentration of the volume of liquid at a specific location of the substrate surface is prevented, since the direction of motion of the liquid changes constantly.

20 Claims, 6 Drawing Sheets

(56) References Cited

U.S. PATENT DOCUMENTS

| | | | |
|---|---|---|---|
| 3,348,246 A * | 10/1967 | Vidal | 114/352 |
| RE28,585 E * | 10/1975 | Amos et al. | 118/56 |
| 3,993,018 A | 11/1976 | Kranik et al. | |
| 4,082,870 A * | 4/1978 | Yenni | 427/425 |
| 4,124,411 A * | 11/1978 | Meuleman et al. | 136/258 |
| 4,693,037 A * | 9/1987 | McNeil | 451/34 |
| 4,822,639 A | 4/1989 | Fujii et al. | |
| 4,889,069 A * | 12/1989 | Kawakami | 118/50 |
| 4,941,426 A * | 7/1990 | Sago et al. | 118/52 |
| 5,095,848 A * | 3/1992 | Ikeno | 118/53 |
| 5,100,699 A * | 3/1992 | Roeser | 427/256 |
| 5,766,354 A | 6/1998 | Ohmori et al. | |
| 5,853,961 A | 12/1998 | Sakai et al. | |
| 6,548,111 B1 * | 4/2003 | Shirley | 427/240 |
| 2004/0234696 A1 * | 11/2004 | Hongo et al. | 427/328 |

FOREIGN PATENT DOCUMENTS

| | | |
|---|---|---|
| GB | 1 566 113 | 4/1980 |
| WO | 03/021648 | 3/2003 |

OTHER PUBLICATIONS

English translation of German Publication No. 1 947 484, published on Mar. 23, 1971.

Official communication issued in counterpart International Application No. PCT/EP2007/001246, mailed on May 24, 2007.

* cited by examiner

APPARATUS AND METHOD FOR SMOOTHLY COATING SUBSTRATES

BACKGROUND OF THE INVENTION

The present invention addresses an apparatus and a method which enable smoothly covering a surface of a substrate with a liquid or a substance dissolved in a liquid, and in particular a concept which enables uniformly applying a chemical coating to a substrate. In particular, one-sided coating, etching, cleaning, drying of flat objects such as, for example, plate-shaped panes of glass or flexible materials is made possible.

Applications wherein carrier substrates may be covered with a thin layer of an additional material are manifold. In this context, the additionally applied layer may be active, for example, i.e. exhibit, e.g., an optical or electrical function. Examples of this are application of a photosensitive layer in the production of solar cells or application of a thin phosphorus layer onto a CCD so as to provide same with a conversion layer, so that the CCD in combination with the conversion layer will also be sensitive to X-radiation. In the event of smooth coating with thin layers performing no active functions, the coating frequently serves as a mechanical protection, as is the case, for example, with audio CDs. Here, after production of the CD, a protective layer of a transparent synthetic resin is applied to the optically readable side of the CCD so as to protect same against damage. In this context, the layer thickness of the protective layer may be applied as smoothly as possible over the entire blank CD so as not to influence, in dependence on the position, the optical properties with regard to, e.g., absorption and reflection behavior of a CCD.

When applying optically or electrically active layers, too, the smoothness of the application, or adherence to a specific desired layer thickness is a major objective, since the layer thickness or its homogeneity has an immediate influence on, e.g., the optical or electrical parameters of a component produced by means of coating.

In lithographic methods which include processing a semiconductor surface by means of etching, it is essential that the semiconductor surface may be covered in a controlled manner with an etchant at a uniform thickness and, so that progression of the etching is effected at the same speed over the entire surface area of the semiconductor to be processed.

Conventionally, one has known various methods of achieving smooth coating of a surface. With CDs, for example, the surface to be coated is made to rotate fast, a material used for the coating then being applied in the vicinity of the axis of rotation, so that the material is automatically distributed, by the centrifugal forces, on the surface of the disk, to which it adheres in a uniform layer thickness on account of adhesive forces. Further methods known are, for example, electroplating, i.e. electrochemical deposition of ions which are dissolved in a liquid onto a surface as well as spraying a surface or dipping surfaces to be coated into a bath of the material used for coating.

With chemical methods based on that at least two reagents, which may form, by chemical reaction, the material used for coating, are applied to the surface of a substrate so that, because of the chemical reaction, the material will deposit on the surface, a number of further basic conditions are to be observed. For one thing, the chemical reaction forming the coating material does not take place on the surface only, but also within the volume of liquid formed of the reagents mixed. Depending on the reaction rate, it is therefore at least inconvenient or even impossible to keep a large stock of premixed reagents so as to perform, for example, a dipping process since, within the large volume of liquid kept on stock, the reagents will consume themselves, as it were, by reacting. In this manner, valuable reagents will be wasted, on the one hand, while, on the other hand, future coating processes using the consumed mixture of reagents will no longer be possible. The time limit for processing additionally suggests economic use of the mixture of reagents during application to the surface to be coated since it will be difficult to reuse the mixture of reagents for further processing once it flows off or is removed from the surface. Methods wherein a mixture of reagents is distributed on the surface by means of rotation, for example, are therefore disadvantageous since most of the mixture of reagents is removed from or centrifuged off the surface.

A method of achieving accelerated reaction of the reagents not before they reach the surface of the substrate to be coated is described by the international patent publication WO 03/021648 A1, which describes a chemical surface-coating process for forming an ultra-thin semiconducting film of group IIB-VIA components on a substrate. In this context, a premixed liquid composition containing group IIB and group VIA components is disposed on a heated substrate, so that, on account of the heat of the substrate, a heterogeneous reaction between the different group elements of the liquid coating is enabled. The reaction on the surface of the substrate is accelerated by supplying thermal energy.

SUMMARY

According to an embodiment, an apparatus for smoothly covering a surface of a substrate with a liquid may have: a holder for the substrate, which is implemented to fix the substrate such that a process volume is formed by the surface of the substrate and the holder; a wetter implemented to introduce the liquid into the process volume onto the surface of the substrate; and a swayer implemented to tilt the holder including the substrate relative to first and second axes, the first and second axes being arranged in a plane parallel to the surface of the substrate and forming a predetermined angle relative to each other so as to thereby distribute the liquid on the surface of the substrate.

According to another embodiment, a method of smoothly covering a surface of a substrate with a liquid may have the steps of: fixing the substrate, so that a process volume is formed by the surface of the substrate and a holder; introducing the liquid into the process volume onto the surface of the substrate; and tilting the holder and the substrate relative to first and second axes, the first and second axes being arranged in a plane parallel to the surface of the substrate and forming a predetermined angle relative to each other so as to thereby distribute the liquid on the surface of the substrate.

In this context, the present invention is based on the finding that the surface of a substrate may be smoothly covered with a liquid when the substrate is fixed in a holding means which forms, together with the surface of the substrate, a process volume into which the liquid may be applied to the surface of the substrate by means of a wetting means, and when, in addition, the holding means including the substrate is set in a swaying motion by means of a swaying means, so that the liquid will smoothly spread on the surface of the substrate. By the swaying motion, concentration of the volume of liquid at a specific location of the substrate surface is prevented, since the direction of motion of the liquid changes constantly. In addition, the consumption of reagents or liquids for coating may be reduced to a large extent since, due to the constantly changing direction of motion of the liquid on the surface of the substrate, the surface is smoothly covered without a large amount of liquid being lost at the edges of the substrate by flowing off the substrate surface.

Thus, coating, etching, cleaning and drying of flat objects, such as plate-shaped panes of glass or flexible materials, in a one-sided manner is enabled in accordance with the invention. Flat objects, i.e. objects having small thicknesses in a direction perpendicular to an extensive main surface shall be referred to below in summary as substrates. These may be, for example, panes of glass, semiconductor surfaces or similar objects, which may also be flexible.

In accordance with the invention, such a substrate may be treated, for example, with CdS made of the reagents ammonia, water, cadmium sulphate or acetate, and thiourea. Treatment with additional components such as alternative reagents, e.g. with Zn acetate, is also possible.

In one embodiment of the present invention a substrate to be covered is fixed in a holding means, the substrate being pressed, from the bottom of the substrate, against a process chamber of the holding means by means of a support frame, said holding means forming a process volume along with the surface of the substrate. The process chamber is configured such that it provides sealants at the edges adjoining the surface of the substrate, so that a liquid applied to the surface of the substrate by means of a wetting means cannot flow off the surface. The holding means is moved, along with the substrate fixed by it, in a swaying manner by a swaying means, i.e. the angle of inclination of the surface of the substrate relative to a starting position parallel to the surface is continually changed in a controlled manner, the liquid located on the surface of the substrate flowing in constantly changing directions on account of the influence of gravity. Swaying of the surface may be caused such that the surface is tilted relative to two axes located in a plane which extends in parallel with the substrate surface. To enable swaying in all directions, the two axes may have an angle relative to each other which may amount to 90°, for example. The axes in relation to which the plane is tilted may also be variable in time. A swaying motion, i.e. tilting of the plane, may be caused, for example, by supporting the substrate at 3 points (which define a plane), it being possible to independently move the 3 supporting points in a direction horizontal to the substrate surface.

Because of the constant swaying motion, which may be effected as early as at the start of wetting by the wetting means, the liquid introduced into the process volume is smoothly distributed so that, with chemical coating of the surface, a surface coating having a uniform thickness distribution will result. Edge effects, which would arise on the walls of the process volume because of adhesive forces if the surface is only sprayed with the liquid in a uniformly thin manner, are also avoided, in particular, by the swaying. Such edge effects would result in that at the edges of the substrate, where the surface of the substrate adjoins the holding means, a thicker layer of liquid would be present on the surface of the substrate than in the central areas of the substrate, so that a coating resulting therefrom would no longer be homogenous in terms of thickness. This may be avoided in a simple and efficient manner by the swaying motion.

In a further embodiment of the present invention, the wetting means enables simultaneous introduction of different liquids into the process volume, so that, with chemical coating, mixing of the reagents forming the coating is not effected until the very moment that the surface of the substrate is being wetted, so that no reduction in efficiency or wasting of the reagents results, as it is the case when they are already previously mixed and are kept on stock in a mixed state.

To further reduce the mixing time and thus to further increase efficiency, the wetting means in one further embodiment of the present invention comprises a mixing means into which different liquids (for example reagents of a chemical coating) flow prior to application to the surface of the substrate, so that faster and smoother mixing may be achieved.

In other words, metering of the reagents applied to the substrate may be performed in different ways. With individual metering onto the substrate, the chemicals are supplied to the process chamber or to the process volume individually. Depending on the process requirements, the order of the metering and the duration of the metering (the metering time) may be specified. With mixing-tank metering, various chemicals may be premixed in a mixing tank and supplied to the substrate or the process volume.

In a further embodiment of the present invention, combined metering is possible wherein some of the chemicals are premixed in a mixing tank or a mixing pipe so as to be supplied to the process chamber in a premixed state. Further reagents may be directly applied to the substrate or supplied to the process chamber without being premixed with other reagents. In this context, the order of the supply and the respective metering-in time may be freely chosen and/or varied.

In addition, it is possible in accordance with the invention to perform metering with the swaying motion switched on, so as to efficiently utilize, all in all, the time taken for metering or supplying the chemicals.

A multitude of sensors or aggregates may be used for metering, i.e. for determining the volume or amount supplied (weight or similar), such as, for example, a weighing cell, a float switch, a vane flow meter, or a metering pump.

In a further embodiment of the present invention it is possible, in addition, to bring the reagents to be supplied to a temperature different from the substrate temperature. This means, consequently, that the reagents may be applied to the substrate in a cooled state, at room temperature or in a heated state. Therefore, depending on the specific process requirements, all or some metering techniques used may optionally be equipped with stirrers, heaters or coolers.

In a further embodiment of the present invention, the process volume formed by the holding means may be sealed in a gas-tight manner, so that there is no danger of any negative effects on the environment even when using gassing reagents which are dangerous to health.

In a further embodiment of the present invention, the holding means is implemented such that the component of the holding means which limits the process volume exhibits, when being placed onto the substrate, a spatial overlap with the substrate which does not exceed 5% of the surface of the substrate, so that, in accordance with the invention, only a small fraction of the available substrate surface is made inaccessible for further process steps by the sealing off.

In a further embodiment of the present invention, the holding means is implemented such that in an open state it allows unimpeded access to the substrate from at least one side of the holding means, so that in the open state of the holding means the substrate may both be moved into and out of the area of the holding means.

In a further embodiment of the present invention, the inventive apparatus additionally comprises a heating means implemented to heat the substrate to a predetermined heating temperature so that, because of the thermal energy supplied, a chemical process which may produce a material to be coated is accelerated mainly on the surface of the substrate. In this context, the swaying ensures that the concentration of the reagents is the same, on average, at every location of the surface, so that the reaction rate of the reagents on the surface of the substrate may be increased without obtaining a locally increased layer thickness, for example at the location where the chemicals are fed in. In this manner, inevitable losses due to reagents which do not react on the surface of the substrate may be further reduced.

In a further embodiment of the present invention, the substrate is heated to a higher temperature along with the chemical supplied. This means that the substrate is press-fitted onto the heater. The reagents are added. The heating temperature is still below the starting temperature for the chemical reaction. In particular, this also means that at the beginning the temperature of the substrate is lower than or equal to the temperature of the chemical. During the swaying motion, the heating temperature is slowly increased to the desired value. In this manner, a slow start of the reaction and smooth coating takes place. This is possible, in particular, since the temperature of the substrate at the moment of feeding in the chemical is still below the reaction temperature of the chemical, i.e. also below the temperature of the chemical, so that the coating process is not started as early as at the first contact of the chemical being fed in.

In a further embodiment of the present invention, the holding device is implemented such that, in the open state, a substrate, for example a glass plate, may be transported into the holding device or out from same from one side of the holding device by means of conventional handling equipment, i.e. using a common transport means, so that the inventive apparatus may readily be integrated into existing production plants.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
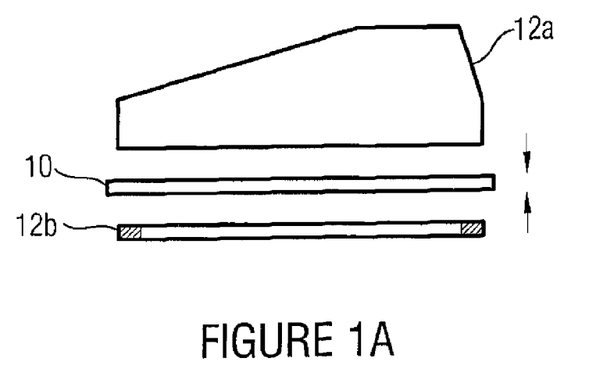
FIGS. 1a-c show an embodiment of an inventive holding device with a direction of motion of the swaying motion.
Figure 1B:
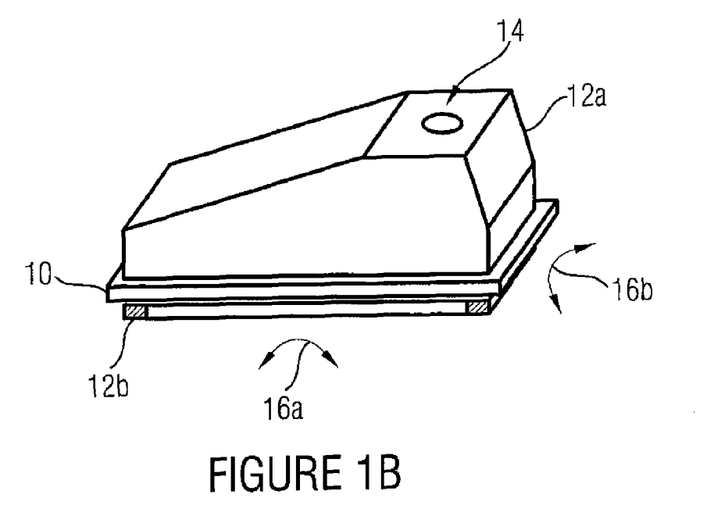
Figure 1C:
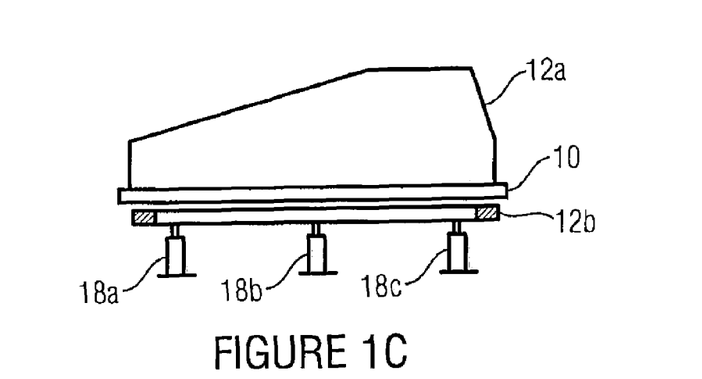

FIGS. 1a to 1c show a schematic representation of the mode of operation of the inventive apparatus for smoothly wetting a surface of a substrate.

In a side view and a perspective view, FIGS. 1a to 1c show the substrate 10 and the holding means consisting of an upper part 12a and a lower part 12b.

FIG. 1a shows the open state of the holding means, and FIGS. 1b and 1c show its closed state.

As is shown in FIG. 1a, the upper part 12a and the lower part 12b of the holding means are initially spatially separate, the substrate 10 being located between the upper part 12a and the lower part 12b, it being possible, in industrial application, for said substrate 10 to be transported there by means of conventional substrate handling equipment.

In the closed state of the holding means the substrate 10 is pressed against the upper part 12a by the lower part 12b, so that the surface of the substrate 10 which is to be coated (top) forms, together with the upper part 12a of the holding means, a process volume into which chemicals may be introduced into the process volume onto the surface of the substrate through an opening 14.

In accordance with the invention, the holding means including the substrate 10 is fixed on a swaying means which may tilt the holding means including the substrate relative to at least two non-parallel axes, so that the entire arrangement is set in a swaying motion. The swaying motion is characterized in that the arrangement does not undergo, as averaged over time, either any rotation or any translation, but that the plane formed by the surface of the substrate is tilted in continually changing orientations relative to its starting position. As an example of potential axes by which the tilting for producing the swaying motion may be effected, mutually orthogonal tilting directions 16a and 16b are only given as an example in FIG. 1b. The swaying mechanism may be realized, for example, by means of three hydraulic supports which are controllable separately from one another, as is depicted in FIG. 1c.

FIG. 1c shows, as the swaying means, three individually controllable hydraulic cylinders 18a to 18c on which the underside 12b of the holding means is borne. The plane defined by the bearing points of the hydraulic cylinders 18a to 18c, which is parallel to the surface of the substrate 10, may now be tilted into any orientation desired by independently moving the individual hydraulic cylinders, which may cause, in accordance with the invention, a swaying motion of the holding means.

What is advantageous in this context is that chemicals used for coating the substrate may also be placed into the opening 14 as late as during the swaying motion, so as not to start a chemical reaction until directly at the start of the coating process. This is advantageous, for example, in increasing the efficiency of coating glass plates with CdS made of the reagents ammonia water, cadmium sulphate or cadmium acetate, thiourea, deionized water.

A major advantage of the holding means further consists in that substrates of various thicknesses may be fixed by means of the clamping mechanism since the fixing is defined via the pressure applied. Adjustment of a clearance corresponding to the thickness of the substrate is therefore not necessary, which enables flexible utilization even with different successive substrates.

Figure 2:
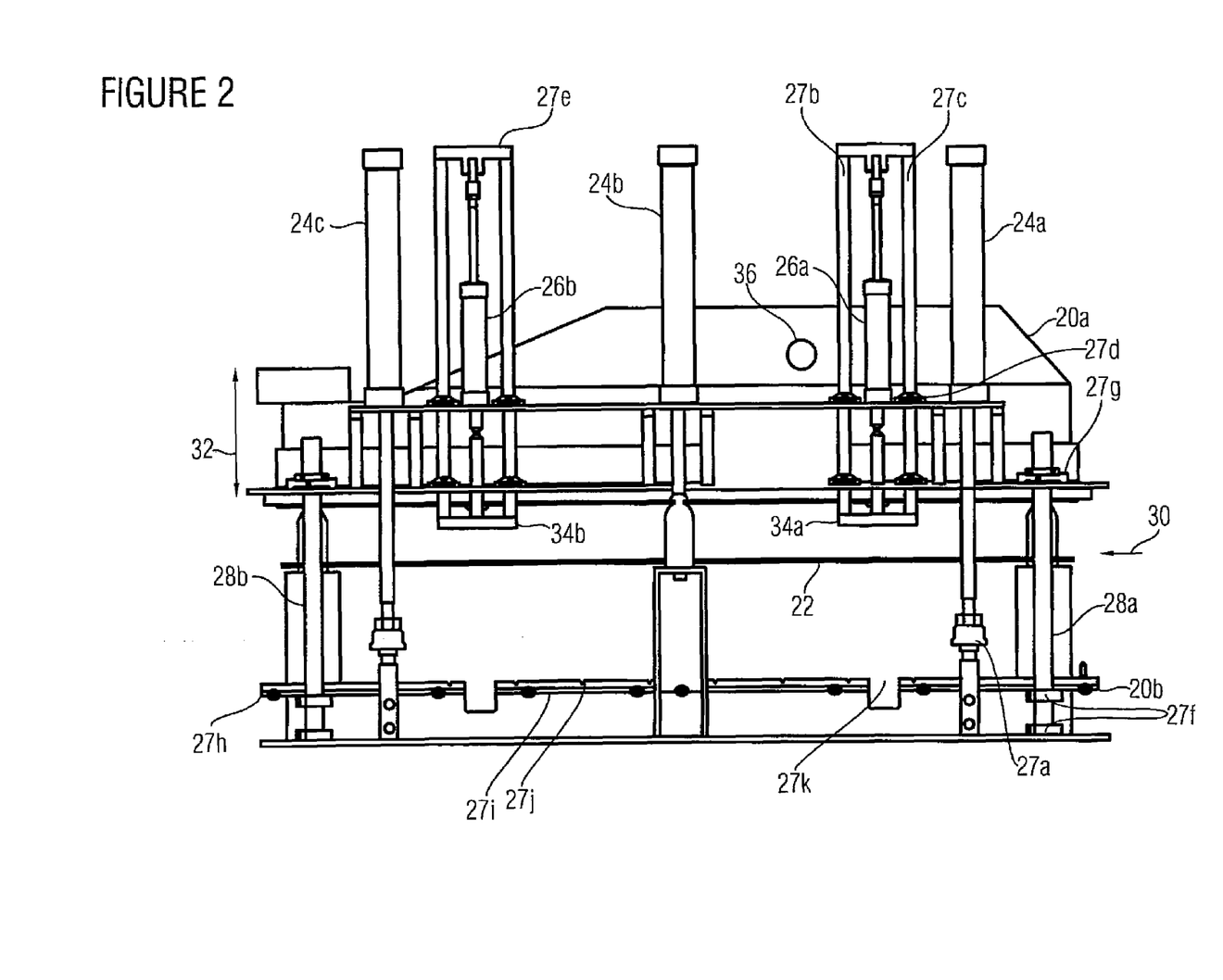
FIG. 2 shows a side view of an embodiment of a inventive apparatus for smoothly coating a surface.

FIG. 2 shows a side view of an embodiment of an inventive apparatus for smoothly covering a surface of a substrate. What is shown is an upper part 20a and a lower part 20b of a holding means, the upper part 20a forming, along with the substrate, the process chamber. What is also depicted is a glass plate 22 representing the substrate to be coated, hydraulic cylinders 24a, 24b and 24c (cylinders for lifting/lowering and press-fitting the process chamber) as well as auxiliary hydraulic cylinders 26a and 26b (cylinders for glass-pane centering device). In addition, guide bars 28a and 28b are shown which ensure that a motion of the upper part 20a of the holding device relative to the lower part 20b may take place only in the vertical direction along a precisely defined axis.

The hydraulic cylinders 24a, b and c are connected to the ground via the pistons, a compensating element 27a being located at the end of the dynamic travel, i.e. at the end of the hydraulic pistons. The auxiliary hydraulic cylinders 26a and 26b are stabilized by means of two guide bars 27b and 27c extending within a guide bearing 27d which enables them to be made to travel in a direction perpendicular to the surface of the substrate (a direction of motion 32). The auxiliary hydraulic cylinders 26a and 26b are connected to the two guide bars via a fork head 27e.

FIG. 2 shows the inventive apparatus for smoothly covering a surface of a substrate in an open position, into which the substrate 22 or the pane of glass may be transported, in a feed direction 30, into or out of the apparatus by means of commercial substrate handling equipment. A direction of motion 32, along which the upper part 20a may move relative to the lower part 20b of the holding device, is specified essentially by the guide bars 28a and 28b. On one side, the guide bars 28a and 28b are fixedly anchored with the ground by means of a guide lock 27f. On the other side, the guide bars are held by means of a guide bearing 27g fixed relative to the upper part 20a. The guide bearing enables the upper part 20a to be moved in the direction of motion 32, it being possible to precisely define the direction of motion by the guide bearings and the guide bars 28a and 28b, so that the hydraulic cylinders 24a, 24b and 24c now only have to produce the force that may be employed for movement, however without having to precisely define the direction of the motion itself. The glass plate 22 may be fixed in the holding means in that it is clamped between the upper part 20a and the lower part 20b of the holding means. Therefore, plastic boards are mounted on the lower part 20b on the side facing the glass plate 22, so as to prevent the glass plate from being damaged. In addition, a seal is provided on the underside of the upper part 20a, so that, when the glass plate 22 is pressed against the upper surface 20a of the holding means, it will define, along with the upper part 20a of the holding means, a process volume from which a liquid introduced into the process volume cannot flow out.

For closing the holding device, the glass plate 22 is initially lifted by means of the auxiliary cylinders 26a and 26b and claws 34a and 34b arranged on the auxiliary cylinders 26a and 26b, and is pressed against the upper part 20a of the holding means. The pressure need not be strong enough for achieving complete sealing off, since this process only serves to prevent the glass plate 22 from slipping out of place during subsequent lowering of the upper part 20a with the glass plate 22 pressed against the upper part. Complete closure is then achieved by means of the hydraulic cylinders 24a to 24c which lower the upper part 20a until it makes contact with the lower part 20b, so that the glass plate is clamped in between the upper part 20a and the lower part 20b, the fitting pressure having to be metered by the hydraulic cylinders 24a to 24c such that sealing off is achieved between the upper part 20a and the glass plate 22. After lowering the upper part 20a, a configuration is thus achieved wherein a substrate 22 or a glass plate is fixed, by means of the holding means, such that a process volume is formed by the surface of the substrate and the holding device. As was already mentioned, the glass plate 22 comes to rest on the plastic boards 27h, which are arranged on a support frame 27i bearing the mechanical load. Venting slots 27j are further arranged in the plastic boards so as to enable air trapped between the glass plate and the plastic boards when the glass plate 22 is press-fitted to escape. In addition, recesses for centering fingers 27k are provided in the plastic boards and in the support frame, so that centering fingers which are fixedly arranged relative to the upper part 20a may ensure that the upper part 20a and the lower part 20b will be press-fitted in a fixed, predetermined position relative to each other. A liquid or a mixture of chemicals may now be placed into the process chamber onto the surface of the substrate by means of a wetting means or a feed opening 36 so as to perform a coating process.

In accordance with the invention, the holding means depicted in FIG. 2 is secured to a swaying means which sets the entire arrangement in a swaying motion so as to enable smoothly covering the surface of the pane of glass 22.

For supplying or removing a substrate or a glass plate 22, the substrate may be removed from or transported into the inventive apparatus at a suitable point of transfer or by means of suitable measures (along the disk feed direction 30) by means of conventional substrate handling equipment. In this context, the point of transfer or the handling equipment may be a commercial roller track, a belt drive or the like. Advantageously, the go end (that side of the glass plate which is to be coated), which is the upper side, is not mechanically contacted either with the handling equipment or within the inventive apparatus, since this glass plate may be pretreated, for example its state may be wet, moist or completely dry.

As may be seen in FIG. 2, handling equipment may introduce the substrate into the open process arrangement through a front opening (right-hand side). In this context, the substrate is initially lowered down onto a holding and centering device to a position between the open upper part 20a and the support frame or the lower part 20b. In one embodiment of the present invention, the centering device initially moves the glass plate upward and presses it against a circumferential seal (edge exclusion). In this manner, it may be prevented that the substrate 20 is displaced relative to the chamber when the chamber is lowered and press-fitted. Subsequently, the process chamber or the upper part 20a may be lowered and press-fitted, on one side, with the substrate 20, so that the substrate 20 is pressed between the upper part 20a and the support frame or lower part 20b, and is sealed off against the upper part 20a by means of a circumferential seal.

In addition, the pane of glass may be heated from the bottom by means of the substrate heating, the one-side thorough warming of the substrate from below being realized by means of a heating mat, an infrared emitter, a recirculation air heater, a water bath or a heat exchanger plate, by which channels introducing heat into the system using hot water or oil of a tempering device are realized.

During the process taking place in the process volume, the process chamber is moved by means of a swaying motion so that the chemical is smoothly mixed and is smoothly distributed on the surface of the substrate up to the edge exclusion. The chemical, which is introduced in a metered manner into the process chamber from the top end via a static mixer, may also be metered and introduced into the process volume during the swaying motion which is to smoothly distribute the chemical on the surface.

In one embodiment of the present invention, opening and closing the process chamber, i.e. moving the upper part 20a and/or the lower part 20b is performed pneumatically. In this context, the structural arrangement of the lift cylinders provides a front opening which extends along the longitudinal side and through which a substrate may be introduced into the process chamber (along the disk feed direction 30). This feeding-in may be performed by means of commercial glass-plate handling equipment.

To enable precise press-fitting, the substrate is placed onto centering pins, for example, by the handling equipment, it being possible for the centering pins to be positioned at an exact transfer height relative to the handling equipment by means of pneumatic cylinders.

In this context, the handling equipment is advantageously implemented such that it will move outward from the area of the process chamber after placing the substrate onto the centering pins, so that the substrate may be moved upward against the circumferential seal and readily press-fitted by the cylinder pins by means of a pneumatic drive. As has already been mentioned, this prevents the substrate or the glass plate 20 from slipping out of place when the upper part 20*a* of the process chamber is lowered. When the process chamber lid 20*a* is lowered, the substrate or the pane of glass 20 is pressed against a support frame or against the lower part 20*b*. The support frame has grooves milled into it, for example, so as to embed the cylinder pins guiding the substrate. In addition, the support frame is provided with a plastic board, for example, which equalizes the fitting pressure, the plastic frame advantageously also having slots arranged therein which allow the air cushion below the substrate to escape.

The cylinders enabling pressing the glass plate against an object or lifting the glass plate may be operated pneumatically, hydraulically or even by means of a spindle drive. In addition, other linear drives are also feasible. Should the pressing cylinder be operated hydraulically or pneumatically, the fitting pressure may be monitored and signaled via an analog pressure sensor, for example. It is thus possible, in accordance with the invention, to press and seal off different substrate thicknesses.

As has already been mentioned, the substrate may be lifted at the "untreated side" prior to and after a process, and in doing so the coated side may not be contacted. Depending on the type of heater used, different lifting and centering devices are advantageously used in this context. One possible implementation is a static finger, for example, which is cranked around the support frame or the lower part 20*b*. When the process chamber is lifted, the disk is automatically also lifted from below so that the disk may be engaged from below. Equivalent lifting may also be performed by means of cylinders.

Lifting may also be realized by a cylinder integrated with a spring and a take-up ram in the support frame or lower part 20*b*. Preferably, the ram is made from a turned part, for example, so that twisting the cylinder cannot have any influence on the lifting of the disk.

In the case of substrate heating by means of a heating plate, a cylinder may be mounted, for example, below the heating plate at at least three locations, said cylinder being able to extend upward through the heating plate which at these locations is provided with a bore, so as to lift the disk.

What is also possible is the implementation by means of a double-lift cylinder mounted outside the process chamber. When the process chamber is opened, the double-lift cylinder is actuated, for example, such that it may laterally swivel small saddles/cantilevers into the free space below the seal of the lower part 20*b* via four levers. The substrate may be lowered down onto saddles which are swiveled into place in such a manner, the substrate being transferred on spring seats and thereby being centered while the chamber is lowered down. Press-fitting of the disk is enabled, for example, in that the saddles swivel outward prior to press-fitting.

Figure 3:
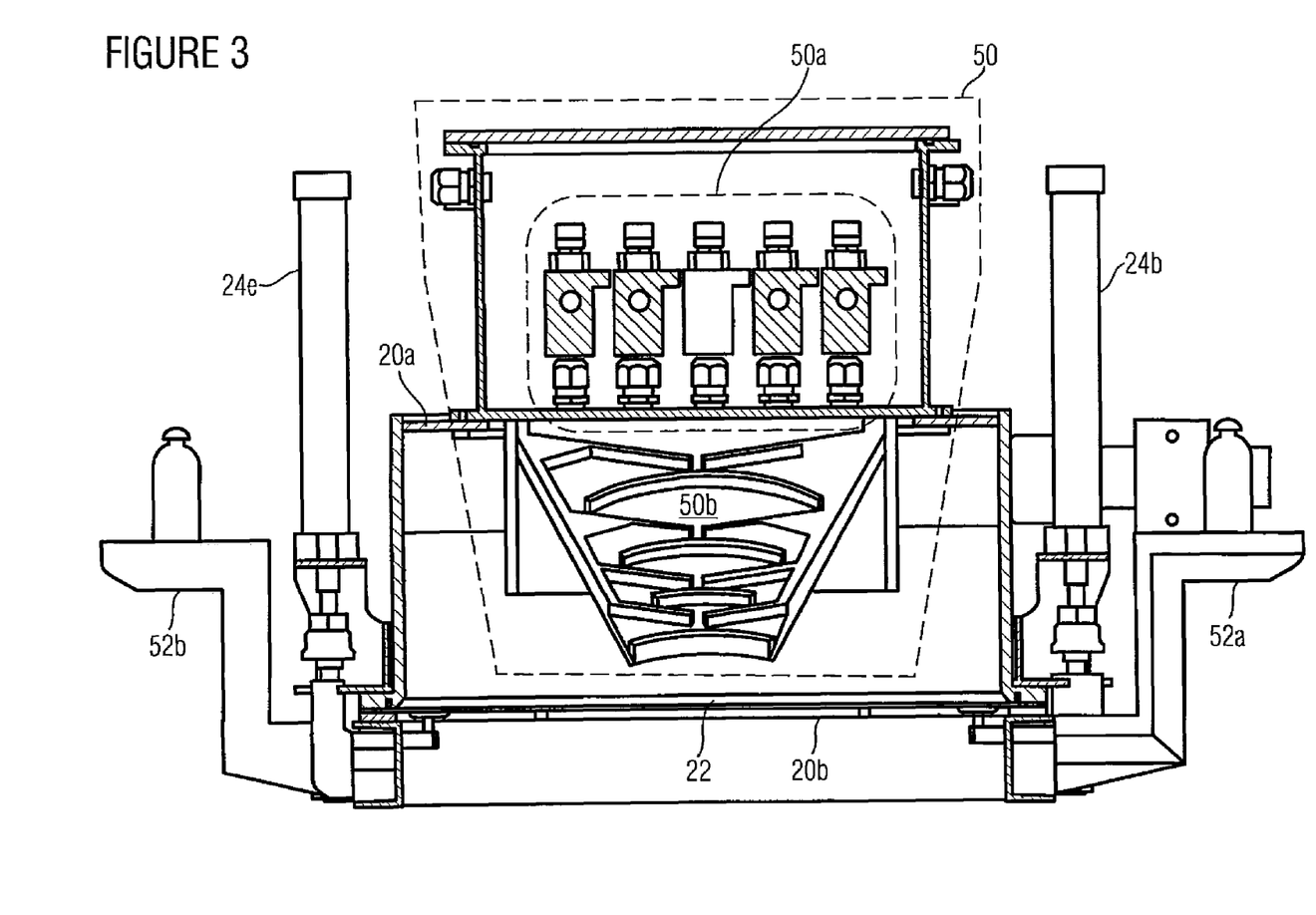
FIG. 3 shows a sectional view of an embodiment of an inventive apparatus for smoothly coating a surface of a substrate.

FIG. 3 shows a sectional image of a view of the inventive apparatus of FIG. 2, the section extending in a plane perpendicular to the view in FIG. 2, and the sectional plane extending between the hydraulic cylinder 24*a* and the hydraulic cylinder 24*b*, the sectional view additionally being represented such that the line of vision is in the direction of the hydraulic cylinder 24*b*.

The process chamber limited by the upper part of the holding device 20*a* is shown in a closed state, i.e. the glass plate 22 is clamped in between the upper part 20*a* and the lower part 20*b* of the holding means. In addition, a hydraulic cylinder 24*a* is shown which can already be seen in the side view of FIG. 2, and, in addition, a hydraulic cylinder 24*d* which is opposite the hydraulic cylinder 24*a* on the opposite side of the upper part 20*a* and which cannot be seen there because of the perspective of the view of FIG. 2. The arrangement of the hydraulic cylinders is symmetric, in particular, so that all in all six hydraulic cylinders are used for lowering and lifting the upper part 20*a*, as may be seen from FIGS. 2 and 3.

In addition, an example is represented of an inventive wetting means 50 comprising inlet valves 50*a* and a mixer 50*b* (static mixer). A plurality of different reagents or chemicals may be introduced into the process volume by means of the inlet valves 50*a* or valve technology, the wetting means additionally comprising, in the depicted embodiment of the present invention, a mixing means 50*b* (static mixer) to facilitate and accelerate thorough mixing of the liquids introduced into the mixing means 50*b* by means of the valves 50*a*. The effectiveness of a coating process is increased in that a mixture which is already homogenous is applied to the surface of the glass plate 22, and in doing so, the time from the beginning of the process of mixing the various chemicals to the beginning of the chemical reaction on the surface of the substrate, i.e. the desired coating process, is kept as short as possible, in addition, in an advantageous manner in accordance with the invention.

Moreover, FIG. 3 shows first and second mechanical cantilevers 52*a* and 52*b*, the cantilevers 52*a* and 52*b* serving as mechanical engagement points of a swaying means in order to enable swaying of the entire arrangement shown in FIG. 3, and being arranged offset to each other in relation to a direction perpendicular to the sectional direction, so that swaying may be achieved by means of three mechanical cantilevers arranged offset to one another, as will be explained in more detail below with reference to FIGS. 6 to 8.

Various metering techniques are possible for the mixing means or the wetting means 50, depending on the process requirement. In principle, any potential metering techniques may optionally be equipped with stirrers or heaters, for which purpose commercial sensors and aggregates are used, for example, for metering, such as weighing cells, float switches, vane flow meters and metering pumps.

A concept for individual metering may be followed wherein the chemicals of the process chamber are supplied to the process chamber individually, where they may be mixed by means of the static mixer 50*b* within the process chamber prior to hitting the substrate.

Also, mixing-tank metering is possible, in which case the chemical is at least partly premixed in a mixing tank and supplied to the process chamber. In this context, additional individual chemicals may be added to the mixture by means of the static mixer 50*b* below the chemicals inflow neck. All mixer methods may additionally also take place with the swaying motion already switched on.

In summary, the present invention thus is an apparatus and a method for coating, etching, cleaning, drying flat objects such as plate-shaped panes of glass, for example. The inventive concept is suitable, for example, for enabling glass plates comprising CdS made of the reagents of ammonia water, cadmium sulphate or cadmium acetate, thiourea, deionized water and potential additional components. Flat object such as glass plates shall be generally referred to as substrates below.

The present invention allows performing one-sided coatings with a small amount of edge exclusion in a low-cost and environmentally sound manner, it being possible, in addition, to process a large variety of substrate thicknesses without having to perform costly mechanical adaptation to the various substrate thicknesses.

Figure 4:
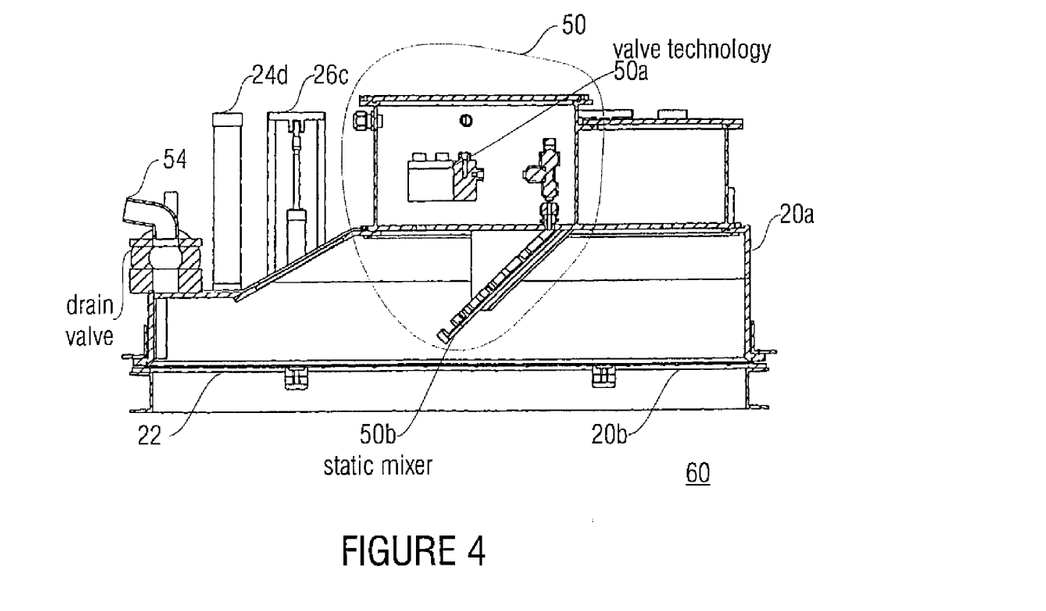
FIG. 4 shows a further sectional view of an embodiment of the present invention.

FIG. 4 shows a further sectional view of the embodiment of the present invention which is depicted in FIG. 3, the section in the view depicted in FIG. 4 running in a sectional plane perpendicular to the plane of the view of FIG. 3, and the section being made centrally through the apparatus shown in FIG. 3, the line of vision being selected such that it points from the hydraulic cylinder 24b to the direction of the hydraulic cylinder 24e. Elements already shown in FIG. 3 which are equal in structure are provided with the same reference numerals. Thus, the descriptions of the individual components of FIGS. 3 and 4 are also mutually applicable.

In addition to the components shown in FIG. 3, FIG. 4 shows a hydraulic cylinder 24d and an auxiliary hydraulic cylinder 26c which, for reasons of perspective, are not visible in FIGS. 2 and 3, but which have the same functionality as the hydraulic cylinders 24a to c and 26a and b, respectively, which were already described with reference to FIGS. 2 and 3. In addition, FIG. 4 shows a drain valve 54 which may be used for removing the chemicals introduced into the process volume when a process module 60 as is depicted with reference to FIG. 4 is tilted relative to an axis extending perpendicular to the surface of the sectional view. As soon as the tilting angle exceeds 90° in a tilting operation to the left, the mixture of chemicals present within the process volume may flow off through the drain valve 54. In one embodiment of the present invention, which shall be described below with reference to FIGS. 7 and 8, a tilting mechanism is therefore provided which enables tilting of the process arrangement 60.

Once the end of the process is reached, i.e. once coating or etching is terminated, the process arrangement 60 may also be drained by swiveling by >90°. Said swiveling may also enable, for example, servicing from the rear side of the process arrangement, i.e. from the underside 20b. In addition, rinsing and pre-drying of the chamber may be provided after draining, for which purpose nozzles pointing into the process volume may be mounted which will introduce a rinsing agent into the chamber, for example in the state where the chamber is tilted to be emptied. After the rinsing process, the chamber is then flipped back. The centering device may subsequently move downward with the lower part 20b and release the glass plate 22 for a handling system. When being taken out of the process arrangement 60, the substrate may additionally be pulled through an air knife, for example, and be pre-dried in the process, care having to be taken that the go end of the substrate (top) may not be contacted by components of the handling equipment.

Rinsing the process chamber may be performed, for example, by means of a rinsing valve fixedly mounted on the lid. In addition, spray nozzles integrated in the lid of the process chamber are also possible, said spray nozzles being mounted at different locations on the underside of the upper part 20a, so that smooth rinsing is ensured.

Figure 5:
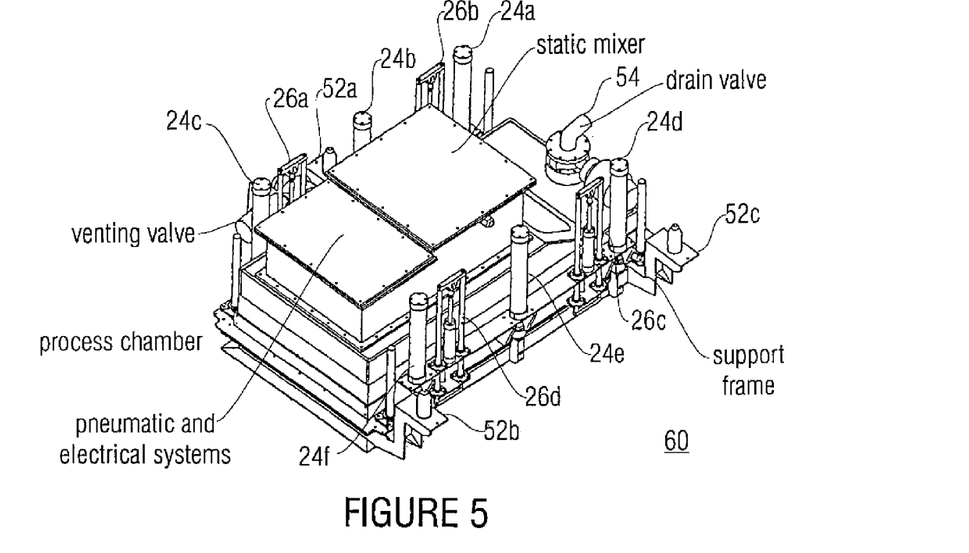
FIG. 5 shows a perspective view of an embodiment of the present invention.

FIG. 5 shows a three-dimensional view of an embodiment of the present invention which was already described with reference to FIGS. 2 to 4. Identical components are designated by the same reference numerals, so that the descriptions of the respective components of FIGS. 2 to 5 are mutually applicable. Only a short description shall be given below, in particular, of those components which have not yet been described by FIGS. 2 to 4.

The three-dimensional view depicts both a hydraulic cylinder 24f and an auxiliary hydraulic cylinder 26d which were covered in FIGS. 2 to 4 by other components because of the perspective used in said figures.

In addition, FIG. 5 shows three mechanical cantilevers 52a, 52b and 52c serving as the mechanical take-up of the process arrangement 60 so as to enable swaying. The plane defined by the three mechanical cantilevers 52 is parallel to the plane of the substrate or glass plate 22, so that the swaying motion of the process arrangement 60 may be caused in that the process arrangement 60 is held and/or supported at the mechanical cantilevers, it being possible to independently move the process arrangement to and fro at the three points, so that the swaying motion of the process arrangement 60 results from the overlay of the motions.

A process arrangement 60 as is depicted with reference to FIG. 5 thus essentially consists of a static mixer 50b, of pneumatic and electrical systems for controlling and/or movement, a drain valve 54, metering valves 50a, a circumferential seal, venting valves as well as a possibility of supplying chemicals. In addition, the support frame already described in FIG. 2 is depicted which has the substrate placed thereon, or with which the substrate is press-fitted. The pneumatic and electrical systems as well as the static mixer are not visible in the 3-dimensional view of FIG. 5, since they are located within a self-contained volume closed off by lids.

The chemicals may be metered from metering tanks by means of the metering valves 50a. In the embodiments described, the metering valves 50a are arranged above the static mixer 50b, so that the chemical may be metered onto the substrate or glass plate 22 under the influence of gravity, following the free downward slope with the process chamber closed. In this context it is advantageous, in particular, that the system is a closed one wherein no chemical vapors may get out. In addition, in the inventive embodiment, the swaying motion may be started during metering already.

The metering valves 50a may also be implemented as 4-way valves, for example. For example after every chemical metering process, one may rinse with N2 to prevent a cross-reaction in the chemicals inlet to the mixer. A third connection of the 4-way valve may be used, for example, for rinsing with deionized water while the process chamber or the process arrangement 60 is tilted. Thus, the entire supply or chemicals supply may be rinsed clear of chemicals residues.

An advantage of the inventive process arrangement 60 is that the static mixer 50b mixes the chemicals with one another before they hit the substrate surface, which avoids stains on the substrate surface. The chemicals may be led from metering tanks to the process arrangement by means of flexible tubes, for example, it being possible for the metering tanks to be arranged externally. In addition, controlled venting of the system by means of a venting valve may be ensured, and the metering valves may be installed into a housing for safety reasons, as is depicted in FIGS. 3 to 5. Even though smooth wetting may be achieved on the substrate surface with a very low consumption of chemicals due to the swaying motion, excess chemicals will remain within the process volume once the process is completed. These may be removed from the chamber through the drain valve 54, for example, when the process arrangement 60 is tilted by an angle of >90°. In addition, spray nozzles for rinsing the chamber clear of the chemical may be arranged in the upper part 20a or in the lid of the process chamber.

In one embodiment of the present invention, a circumferential seal is incorporated into the upper part 20a of the chamber at the interface between the substrate and the upper part. Said seal seals off the chemical, which is splashing around, against the outside, which is also true, at the same time, for the rinsing liquid to be used. For pneumatic control and electrical control, a pneumatic/electrical systems cabinet may be mounted in the immediate vicinity next to the valves and the cylinders of the hydraulic system. Short signal paths then guarantee uniform control of the cylinders and valves.

The process chamber housing itself, i.e. that part of the housing which forms the process volume, may then consist, for example, of a base frame consisting of stainless steel and comprising an attached press-fitting mechanism. The process chamber housing may be coated with plastic or Halar, for example, depending on the chemicals and the temperatures to be used. In this context, a seal which is advantageously mounted on the underside of the upper part 20a may be milled into the process chamber housing, the seal advantageously being milled in the stainless-steel frame and advantageously being coated when high processing temperatures are used. At relatively low temperatures, it may also be milled into or attached to a plastic frame, the plastic frame being welded or screwed together with the interior lining. The stiffening braces which may be used to enhance mechanical stability of the process chamber housing may either consist of stainless steel or, for example, of stainless steel coated with plastic or Halar. A window or a viewing lid which is screwed onto the frame by means of a seal from above may additionally be mounted for monitoring the process. The support frame or the lower part 20a may also be made of a stainless steel profile, for example, in one embodiment the stainless steel profile comprising ventilation slots so as to prevent any pressure differences which may occur upon closure of the process arrangement 60. In addition, the support frame may be provided with a seal arranged, for example, within millings. Such seals which consist of PP or rubber, for example, serve, for one thing, to protect the rear side of the substrate, and may additionally be configured such that they allow air to escape.

Figure 6:
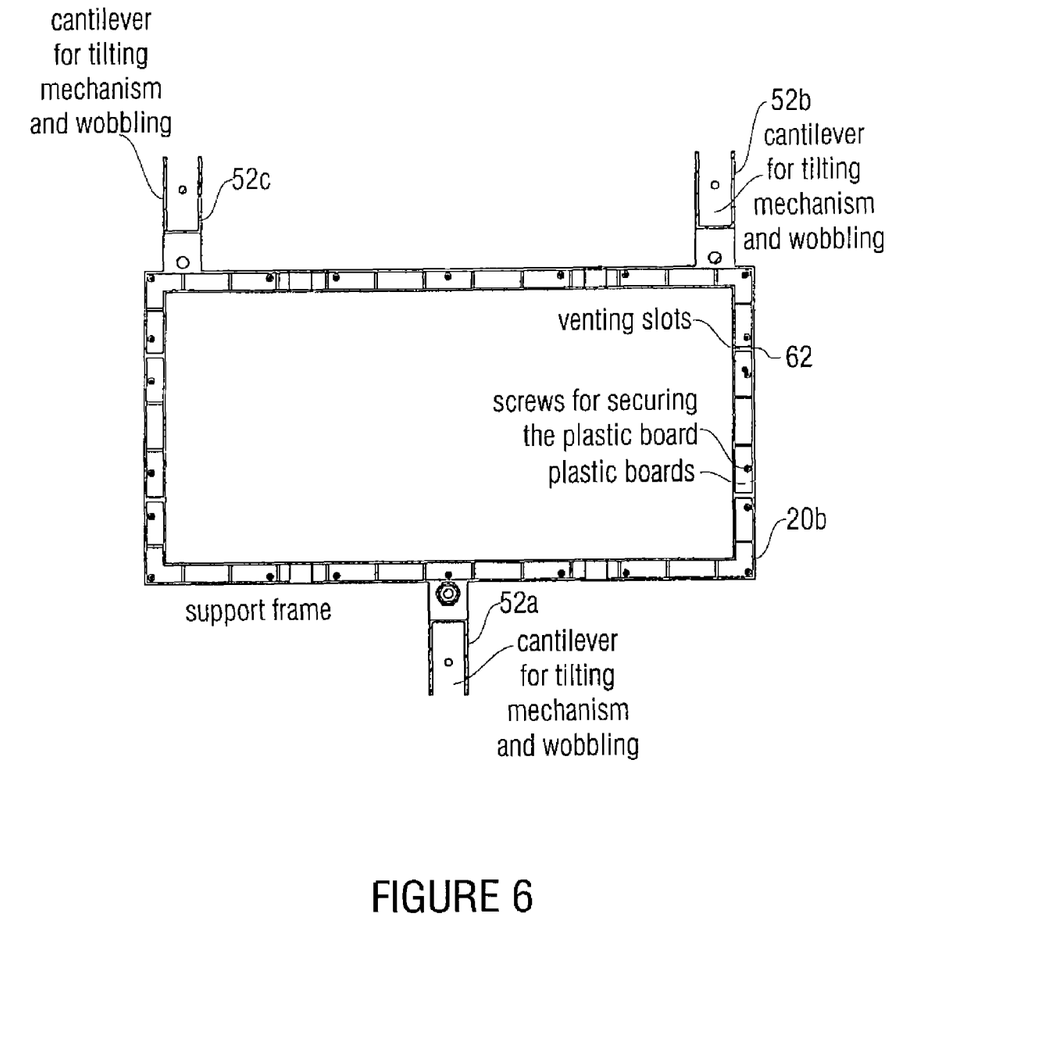
FIG. 6 shows a top view of an embodiment of the present invention.

To illustrate in more detail the mode of operation of the mechanical cantilevers 52a to 52c which may be employed for achieving an inventive swaying motion, FIG. 6 depicts a top view of an example of an inventive support frame, or lower part, 20b. The top view shows the lower part, or support frame, 20b, on which the substrate or the glass pane 20 comes to lie. The three mechanical cantilevers 52a to 52c are mounted on the support frame 20b on different sides of the support frame 20.

In the embodiment shown in FIG. 6 of an inventive support frame 20b, plastic boards are additionally mounted on the upper side of the support frame 20b so as to protect the substrate which is placed on the support frame 20b from being damaged. In addition, venting slots 62 which prevent an overpressure from being formed between the substrate and the support frame 20b while the substrate is lowered down are provided between the plastic boards.

Because of the geometric arrangement of the mechanical cantilevers 52a to 52c (cantilevers for tilting mechanism and wobbling), they define, at three points, a plane parallel to the plane of the substrate. In accordance with the invention, the point of support of each of the mechanical cantilevers 52a to 52c may have an individually controllable device mounted thereat which has a direction of motion perpendicular to the plane of the view of FIG. 6, so that at the three points defined by the mechanical cantilevers 52a to 52c the plane and, along with it, the substrate may be moved or tilted, as a result of which a swaying motion of any orientation is achieved. Moreover, FIG. 6 shows some implementation details, such as the venting slots 62 already described, in a top view, and screw holes or screws for securing the plastic board or boards.

Figure 7:
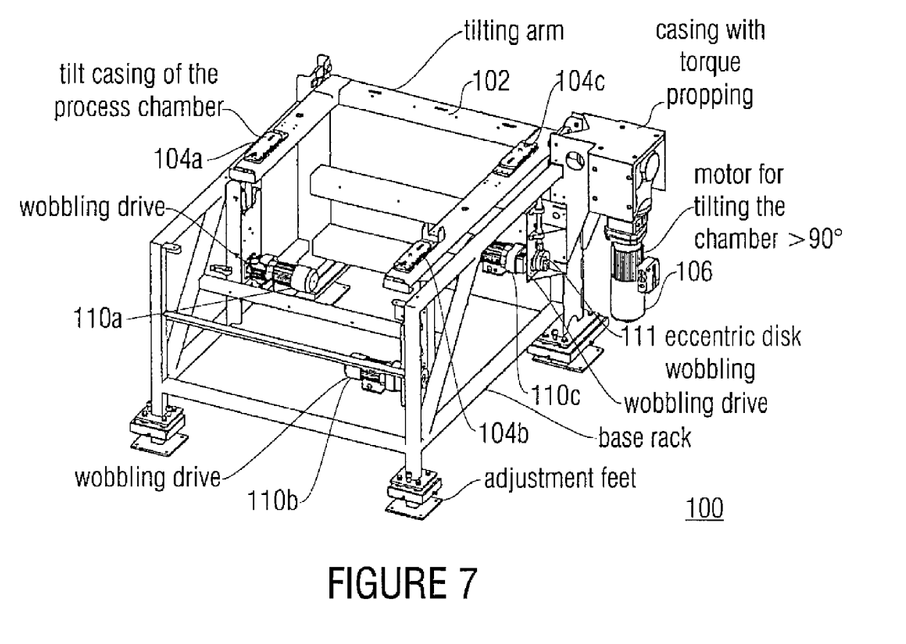
FIG. 7 shows an embodiment of an inventive swaying means.

FIG. 7 shows an embodiment of the present invention wherein the swaying motion may be achieved by means of a base rack 100 which may have an inventive process arrangement 60, for example, attached to it by means of the mechanical cantilevers 52a to 52c.

The base rack 100 comprises a tilting axis 102 as well as three locking means 104a to 104c which correspond with the mechanical cantilevers 52a to 52c and are suitable for connecting the base rack 100 to an inventive process arrangement 60. The base rack 100 may be connected to the process arrangement 60 in a mechanically rigid manner when the mechanical cantilevers 52a to 52c are arranged on the locking means 104a to 104c (tilt-locking of the process chamber). With a mechanically rigid connection, a tilting motor 106 (motor for tilting the chamber >90°) serves to cause the tilting axis 102 (tilting arm) to rotate, and thus serves to tilt the entire process arrangement 60, which is secured at the locking means 104a to 104c, from the horizontal to the vertical and beyond. In this manner, draining of the process volume via the drain valve 54 may be achieved, in accordance with the invention, on the one hand, and on the other hand, the entire process arrangement 60 may be rotated by 180° to the horizontal so that it becomes accessible from the underside for potential servicing work.

Moreover, the base rack 100 serves to cause the swaying motion of the process arrangement 60 located within the base rack. To cause the swaying, the mechanically rigid connection between the mechanical cantilevers 52a to 52c and the locking means 104a and 104c is released, so that the process arrangement is loosely supported on the base rack 100, as it were. As was already described above, the swaying is achieved in that at the mechanical cantilevers 52a to 52c an independent movement perpendicular to the surface of the substrate or of the plane formed by the mechanical cantilevers 52a to 52c is performed in each case. In the embodiment of the present invention, this is achieved in that the base rack 100 has a motor 110a to 110c (wobbling drive) mounted to it underneath each locking an eccentric disk (eccentric disk wobbling) being attached to the motor axis of said motor. Similar to the connecting rod in the internal combustion motor of a car, an advance ram is attached at the radius of the eccentric disk so that, on account of the eccentric movement, the advance ram performs a periodic movement perpendicular to the substrate surface, or perpendicular to the plane formed by the mechanical cantilevers 52a to 52c. Thus, for example, a uniform wobbling or swaying motion may be caused if the eccentric disk is mounted on the motors 110a to 110c in such a manner that each push rod achieves the maximum stroke at a different point in time.

Thus, the base rack 100 serves to take up the tilting mechanism and to cause the swaying motion. In this context, the base rack may additionally be mounted into a plastic housing so as to impede discharge of chemicals. As may be seen in FIG. 7, the base rack additionally is equipped with adjustment feet which enable complete horizontal alignment of the unit. The swaying motion is realized with three motors 110a to 110c which make the process chamber or the process arrangement 60 sway by means of one eccentric disk in each case. Because of their geometric configuration, the eccentric disks perform a sine movement, wherein the stroke of the movement may be continuously adjustable by varying the eccentric disks or by suitably setting same, so that the absolute amount of swaying of the inventive process arrangement 60 may be set. The tilting motor 106 for tilting the process chamber may tilt the process arrangement by up to 180°, for example. At a tilting angle >90°, the process chamber is drained, at 180° the process chamber may be serviced from the rear side or from below, i.e. seals may be replaced, and the process chamber may be cleaned. The drive of the tilting device may additionally be configured in a pneumatic or hydraulic manner, for example.

The locking means 104a to 104c serve to mechanically lock and unlock the process arrangement 60. During the swaying motion, a sledge is open, and the process chamber or process arrangement 60 is loosely supported on three rams of the eccentric process movement. This ensures a smooth swaying motion, it also being possible to monitor the position of the eccentric disks and/or of the guide or push rods by means of sensors.

Once the swaying motion has ended, the process chamber may be moved to a zero position, i.e. to a horizontal position, and be locked with the three locking means 104a to 104c, it also being possible to monitor successful locking and/or unlocking by means of sensors.

Figure 8:
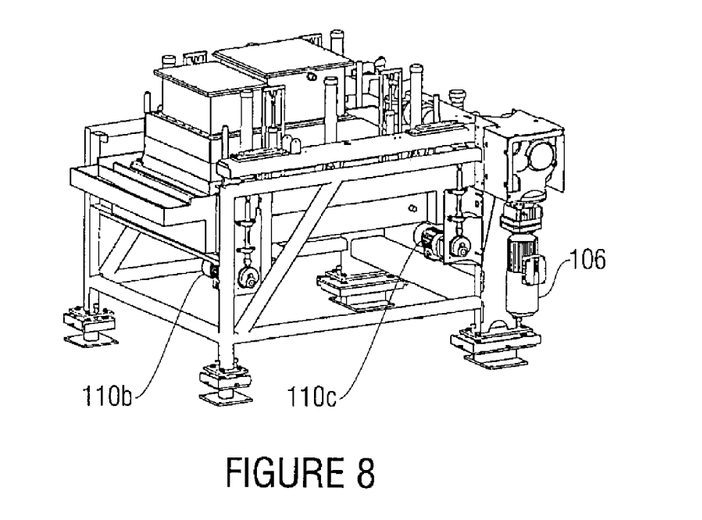
FIG. 8 shows a perspective view of an embodiment of the present invention.

FIG. 8 shows an inventive process arrangement 60 in a state in which it is mounted into the base rack 100, so as to illustrate how the process arrangement may be tilted as a whole by means of the tilting motor 106, and how, in addition, the swaying motion may be caused by means of the motors 110a to 110c which act upon eccentric disks.

Moreover, it is possible, by means of the inventive concept, to realize, on the basis of the arrangement shown in FIG. 8, a modular installation concept consisting of so-called process modules which comprise the arrangement shown in FIG. 8. Each module may be used as an independent process module and may be arranged, for example, at any location within a storehouse. Each such process module then has to be supplied with substrate plates or glass plates by means of commercial substrate handling equipment, which is possibly additionally adapted to the process requirements. The handling equipment transfers the glass plates within the arrangement depicted in FIG. 8 and, after a process has ended, it removes a glass plate from said arrangement. The choice of material both of the handling equipment and of the components of the process arrangement 60 which contact the substrate may be adapted to the process requirements. Materials that may be used are, e.g., stainless steel, plastic as well as plastic-coated stainless steel parts which may form dripping troughs or casings, for example.

A modular principle has the advantage that individual process modules may be put out of service while others are still in production mode. In particular because of the tilting device, servicing of individual modules is possible without impeding further modules which are possibly still being produced. Increased flexibility in this context results from that individual modules may be built in any order and number, the cycle time being determined by, among other things, the number of the modules used. Metering stations, i.e. stations which supply the chemicals, may either be independent units which serve several modules at the same time or are integrated into the individual modules.

Even with a modular structure, loading and unloading of the process chambers with substrates may be effected by means of commercial handling systems. Multi-axis linear axes, robots, roller tracks, belt conveyors, revolving transfer machines and vacuum wands, for example, may be employed in this context.

Even though the mode of operation of the inventive concept was described above mainly with reference to the example of a pane of glass, any substrates, for example PCBs, may be advantageously coated by means of the inventive concept.

In particular, the type of substrate handling equipment, i.e. the manner in which substrates to be coated may be positioned within the inventive apparatus, is irrelevant for successful application of the inventive concept. The chemicals mentioned in the descriptions of the embodiments of the present invention are to be seen as examples. The inventive concept is also suitable, in particular, for etching surfaces, smooth application of an etching liquid also being relevant for successfully performing a smooth etching process over a substrate having a large surface area.

Generation of a swaying motion was realized, with reference to the embodiments described, by three hydraulic cylinders which are individually controllable, or by means of eccentric disks driven by motors. Of course, any other possibilities of generating a swaying motion are also suited to successfully put the inventive concept into practice.

The hydraulic cylinders, which in the embodiments of the present invention described serve to lift the substrates or to close the holding device, may be replaced by any other mechanical mechanisms enabling pressing or lifting of a substrate.

Even though in the above-discussed embodiments the entire holding means including the substrate fixed within the holding means was set in a swaying motion relative to the surface of the earth (horizontal), it is alternatively also possible to only set the substrate in a swaying motion, it then being possible to ensure additionally, by suitable measures, that the liquid present on the surface of the substrate cannot flow off the surface. For example, sealing-off by means of flexible bellows made of rubber would be feasible, so that the upper part of the holding means may remain essentially rigid, and that only the lower part, on which the bellows and the substrate are attached, performs the swaying motion.

Moreover, complete sealing off of the process volume is not absolutely necessary.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for smoothly covering a surface of a substrate with a liquid, comprising:
   a holder for the substrate, which is implemented to fix the substrate such that a process volume is formed by the surface of the substrate and the holder;
   a wetter implemented to introduce the liquid into the process volume onto the surface of the substrate; and
   a swayer implemented to tilt the holder comprising the substrate relative to first and second axes so that the substrate does not undergo, as averaged over time, any rotation; the first and second axes being arranged in a plane parallel to the surface of the substrate and forming a predetermined angle relative to each other so as to thereby distribute the liquid on the surface of the substrate.

2. The apparatus as claimed in claim 1, wherein the swayer comprises three supporters which are controllable independently of one another and are mounted on the holder so as to stabilize it, the supporters being able to perform, independently of one another, a movement in a direction which is essentially perpendicular to the surface of the substrate.

3. The apparatus as claimed in claim 2, wherein the supporters are hydraulic supports.

4. The apparatus as claimed in claim 2, wherein the supporters comprise push rods, each of which is eccentrically attached to a rotating carrier, the push rods performing the movement in the direction which is essentially perpendicular to the surface of the substrate.

5. The apparatus as claimed in claim 4, wherein the supporters are implemented such that the eccentricity of the attachment of the push rods is adjustable to vary a stroke of the movement in the direction which is essentially perpendicular to the surface of the substrate.

6. The apparatus as claimed in claim 1, wherein the wetter comprises several inlet nozzles for simultaneously introducing different liquids.

7. The apparatus as claimed in claim 6, wherein the wetter comprises a mixer implemented to mix the different liquids.

8. The apparatus as claimed in claim 1, wherein the wetter is implemented to introduce one or more of the following reagents into the process volume:
    ammonia water,
    cadmium sulphate,
    cadmium acetate,
    thiourea,
    deionized water.

9. The apparatus as claimed in claim 1, wherein the holder is implemented to fix a flat substrate wherein the lateral extensions are at least ten times larger than the thickness of the substrate.

10. The apparatus as claimed in claim 1, wherein the holder is implemented to fix a glass substrate.

11. The apparatus as claimed in claim 1, wherein the holder is implemented to fix the substrate such that in a closed state of the holder at least 95% of the surface of the substrate is freely accessible to the liquid from the side of the process volume.

12. The apparatus as claimed in claim 1, wherein the holder is implemented to fix substrates comprising varying thicknesses within a predetermined range of thicknesses.

13. The apparatus as claimed in claim 1, wherein the holder is implemented to form, with the substrate fixed, a self-contained process volume so that in a closed state of the holder the liquid cannot leave the process volume.

14. The apparatus as claimed in claim 1, wherein the holder is implemented such that in a closed state, the substrate is pressed between a lid facing the surface of the substrate and a base frame adjoining the underside of the substrate.

15. The apparatus as claimed in claim 1, wherein the holder is implemented to enable, in an open state of the holder, removing the substrate from the holder and supplying the substrate into the holder.

16. The apparatus as claimed in claim 1, additionally comprising a draining device implemented to enable draining the liquid from the process volume.

17. The apparatus as claimed in claim 16, wherein the draining device comprises a valve and a swiveler for swiveling the holder, the valve being arranged in the process volume in such a manner that when a predetermined swiveling angle is reached, the liquid may flow out of the process volume through the valve.

18. The apparatus as claimed in claim 1, further comprising a heater implemented to heat the substrate from a substrate start temperature to a predetermined reaction temperature.

19. The apparatus as claimed in claim 18, wherein the heater is implemented to vary a substrate temperature of the substrate such that the substrate temperature is smaller than or equal to a liquid temperature of the liquid applied to the surface of the substrate by the wetter.

20. The apparatus as claimed in claim 18, wherein the heater is implemented to heat the substrate from the side facing away from the process volume.

* * * * *